(12) United States Patent
Park et al.

(10) Patent No.: US 8,001,451 B2
(45) Date of Patent: Aug. 16, 2011

(54) TRELLIS ENCODER AND TRELLIS ENCODING DEVICE HAVING THE SAME

(75) Inventors: Eui-jun Park, Seoul (KR); Jung-jin Kim, Seoul (KR); Seok-hyun Yoon, Suwon-si (KR); Kyo-shin Choo, Yongin-si (KR); Keon-yong Seok, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1071 days.

(21) Appl. No.: 11/774,799

(22) Filed: Jul. 9, 2007

(65) Prior Publication Data

US 2008/0130776 A1 Jun. 5, 2008

(30) Foreign Application Priority Data

Dec. 4, 2006 (KR) ........................ 10-2006-0121554

(51) Int. Cl.
*H03M 13/03* (2006.01)
(52) U.S. Cl. ...................................... 714/792; 714/801
(58) Field of Classification Search .................. 714/792, 714/801
See application file for complete search history.

(56) References Cited

U.S. PATENT DOCUMENTS

| | | | |
|---|---|---|---|
| 6,088,827 A | 7/2000 | Rao | |
| 6,594,094 B2 | 7/2003 | Rae et al. | |
| 6,718,502 B1 | 4/2004 | Kuznetsov et al. | |
| 6,996,767 B2 * | 2/2006 | Chang et al. | 714/786 |
| 7,111,221 B2 * | 9/2006 | Birru et al. | 714/792 |
| 2001/0025358 A1 * | 9/2001 | Eidson et al. | 714/792 |
| 2003/0028843 A1 * | 2/2003 | Chang et al. | 714/786 |
| 2005/0249301 A1 | 11/2005 | Jeong et al. | |

FOREIGN PATENT DOCUMENTS

KR 10-683879 2/2007

OTHER PUBLICATIONS

Search Report issued Jul. 27, 2007 by the International Searching Authority for International Application No. PCT/KR2007/002233.

* cited by examiner

*Primary Examiner* — M. Mujtaba K Chaudry
(74) *Attorney, Agent, or Firm* — Sughrue Mion, PLLC

(57) ABSTRACT

A trellis encoding device includes a plurality of trellis encoders to perform trellis-encoding of a transport stream into which a supplementary reference signal (SRS) has been inserted, and performs a memory reset in a region that precedes an SRS; and a parity compensation unit to compensate for parities of the transport stream in accordance with values stored in memories included in the trellis encoders. The plurality of trellis encoders may be implemented in diverse types. The trellis encoding device can perform a memory reset selectively using the stored value of the memory and the inverted value thereof, or selectively using the stored value of the memory and a fixed value. By properly resetting the memory in processing the transport stream into which the SRS has been inserted, DC offset can be reduced.

26 Claims, 13 Drawing Sheets

FIG. 12

Symbol Mapper $Z_2$ →

$Z_1$ →

$Z_0$ →

| $Z_2$ | $Z_1$ | $Z_0$ | R |
|---|---|---|---|
| 0 | 0 | 0 | −7 |
| 0 | 0 | 1 | −5 |
| 0 | 1 | 0 | −3 |
| 0 | 1 | 1 | −1 |
| 1 | 0 | 0 | +1 |
| 1 | 0 | 1 | +3 |
| 1 | 1 | 0 | +5 |
| 1 | 1 | 1 | +7 |

MAP

→ R

TRELLIS ENCODER AND TRELLIS ENCODING DEVICE HAVING THE SAME

CROSS-REFERENCE TO RELATED APPLICATION

This application claims the benefit of Korean Application No. 2006-121554, filed Dec. 4, 2006 in the Korean Intellectual Property Office, the disclosure of which is incorporated herein by reference.

BACKGROUND OF THE INVENTION

1. Field of the Invention

An aspect of the present invention relates to a trellis encoder and a trellis encoding device having the same. More particularly, the present invention relates a trellis encoder and a trellis encoding device having the same, which performs initialization of a supplementary reference signal (SRS) before encoding the SRS in a digital broadcast transmitter for transmitting a transport stream into which the SRS has been inserted.

2. Description of the Related Art

With the development of electronic and communication technologies, digital technologies have been introduced into the field of broadcasting system, and diverse standards for the digital broadcasting have been published. One of such standards is an Advanced Television Systems Committee (ATSC) Vestigial Sideband (VSB) system that is an American-type digital terrestrial broadcasting system. The ATSC VSB system is a signal carrier type broadcasting system, and uses a field sync signal in the unit of 312 segments.

FIG. 1 is a block diagram illustrating the construction of a transmitter/receiver of an ATSC DTV standard as a general American-type digital terrestrial broadcasting system. Referring to FIG. 1, the digital broadcast transmitter includes a randomizer 11, a Reed-Solomon (RS) encoder 12, an interleaver 13, a trellis encoder 14, a multiplexer (MUX) 15, and a modulator 16.

The randomizer 11 randomizes a transport stream. The RS encoder 12 performs an RS encoding that adds RS parity bytes to the randomized transport stream in order to correct bit errors occurring due to the channel characteristic in a transport process. The interleaver 13 interleaves the RS-encoded data according to a specified pattern. The trellis encoder 14 performs a trellis encoding of the interleaved RS-encoded data at the rate of ⅔ and then performs mapping of the trellis-encoded data onto 8-level symbols. The MUX 15 inserts a field sync and a segment sync into the transport stream outputted from the trellis encoder 14. The modulator 16 inserts a pilot tone into an output signal of the MUX 15 by adding a DC value into the output signal of the MUX 15, performs VSB modulation of the output signal, and then performs up-conversion of the modulated signal into an RF channel signal to transmit the converted signal through a channel.

The modulated signal transmitted from the digital broadcast transmitter is inputted to a receiver through the channel. A digital broadcast receiver as illustrated in FIG. 1 includes a demodulator 21, an equalizer 22, a Viterbi decoder 23, a deinterleaver 24, an RS decoder 25, and a derandomizer 26. The demodulator 21 performs a sync detection and demodulation of the received signal. The equalizer 22 compensates for a channel distortion of the demodulated signal. The Viterbi decoder 23 corrects errors of the equalized signal and decodes the equalized signal to symbol data. The deinterleaver 24 rearranges the data dispersed by the interleaver 13 of the digital broadcast transmitter. The RS decoder 25 corrects errors according to parities. The derandomizer 26 derandomizes the data corrected through the RS decoder 25 and outputs an MPEG-2 transport stream. The digital broadcast transmission/reception is performed in the above-described manner.

FIG. 2 illustrates a VSB data frame for use in the American type digital broadcasting (8-VSB) system. As shown in FIG. 2, one frame is composed of two fields. One field is composed of one field sync segment that is the first segment, and 312 data segments. Also, one segment in the VSB data frame corresponds to one MPEG-2 packet, and is composed of a segment sync signal of four symbols and 828 data symbols.

In FIG. 2, the segment sync signal and the field sync signal are used for the synchronization and equalization in the digital broadcast receiver. That is, the field sync signal and the segment sync signal refer to known data between the digital broadcast transmitter and receiver, which is used as a reference signal when the equalization is performed in the receiver side.

On the other hand, in order to improve the performance of receiving turbo streams, a technique of inserting a supplementary reference signal (SRS) into a dual transport stream has been developed. Accordingly, it is required to provide a technique for properly encoding the dual transport stream into which the SRS has been inserted. In this case, since the value of the SRS may differ according to values pre-stored in memories provided in the trellis encoder 14, it is necessary to provide a method of properly resetting the memories in the trellis encoder 14 after processing the SRS. In addition, if the memory is compulsorily set to "0" in a memory resetting process, a value outputted by the mapper of the trellis encoder 14 may have a DC offset. Accordingly, a need exists for a method for solving the above-described problems.

SUMMARY OF THE INVENTION

An aspect of the present invention is to provide a trellis encoder and a trellis encoding device having the same, which can prevent errors in recognizing a supplementary reference signal (SRS) by properly resetting a memory in the process of trellis-encoding a transport stream into which the SRS has been inserted.

Another aspect of embodiments of the present invention is to provide a trellis encoder and a trellis encoding device having the same, which can prevent the occurrence of DC offset due to a memory reset by properly adjusting values newly stored in memories in a memory resetting process.

A trellis encoding device, according to embodiments of the present invention, includes a plurality of trellis encoders to perform trellis-encoding of a transport stream into which a supplementary reference signal (SRS) has been inserted, and perform a memory reset in a region that precedes an SRS process in their individual ways, respectively; and a parity compensation unit to compensate for parities of the transport stream in accordance with values stored in memories included in the trellis encoders.

According to another aspect of the present invention the trellis encoders may include at least one type of trellis encoder amongst five types of trellis encoders.

According to another aspect of the present invention the first type trellis encoder may have first to third memories, and set the first to third memories to zero at a time point where a first signal value that belongs to the region that precedes the SRS process is received.

According to another aspect of the present invention the first type trellis encoder may include first to third memories;

a first MUX to selectively output one of a signal value in the transport stream and a value stored in the first memory in accordance with an external control signal; a first adder to add an output value of the first MUX to the value stored in the first memory, and store the resultant value of addition in the first memory; a second MUX to selectively output one of a signal value in the transport stream and a value stored in the second memory in accordance with the external control signal; and a second adder to add an output value of the second MUX to the value stored in the second memory, and store the resultant value of addition in the third memory.

According to another aspect of the present invention the first MUX may select and output the value stored in the first memory if the external control signal is a reset signal, and the first adder may perform an exclusive OR of the output value of the first MUX and the value stored in the first memory, and store the resultant value of the exclusive OR in the first memory.

According to another aspect of the present invention the second MUX may select and output the value stored in the second memory if the external control signal is the reset signal, and the second adder may perform an exclusive OR of the output value of the second MUX and the value stored in the second memory, and store the resultant value of the exclusive OR in the third memory.

According to another aspect of the present invention the second or third type trellis encoder may have first to third memories, maintain the value stored in the first memory as is, and set the third memory to zero at a time point where a first signal value among signal values that belong to the region preceding the SRS process is received, while it sets the first memory to a specified value and sets the second memory to zero at a time point where a second signal value that follows the first signal value is received.

According to another aspect of the present invention the second type trellis encoder may comprise first to third memories; a first MUX to selectively output one of a predetermined fixed value and the value stored in the first memory in accordance with a first external control signal; a second MUX to selectively output one of a signal value in the transport stream and an output value of the first MUX in accordance with a second external control signal; a first adder to add an output value of the second MUX to the value stored in the first memory, and store the resultant value of addition in the first memory; a third MUX to selectively output one of the signal value in the transport stream and the value stored in the second memory in accordance with the second control signal; and a second adder to add an output value of the third MUX to the value stored in the second memory, and store the resultant value of addition in the third memory.

According to another aspect of the present invention the first MUX may select and output the fixed value if it is judged that the present region is a first reset region in accordance with the first external control signal, and select and output the value stored in the first memory if it is judged that the present region is a second reset region that follows the first reset region. The second MUX may select and output the signal value in the transport stream if the second external control signal is the reset signal, and select and output the output value of the first MUX if the second external control signal is a general operation signal. The first adder may perform an exclusive OR of the output value of the second MUX and the value stored in the first memory, and store the resultant value of the exclusive OR in the first memory.

According to another aspect of the present invention the third MUX may select and output the value stored in the second memory if the second external control signal is the reset signal, and the second adder may perform an exclusive OR of the output value of the third MUX and the value stored in the second memory, and store the resultant value of the exclusive OR in the third memory.

According to another aspect of the present invention the third type trellis encoder may include first to third memories; a first MUX to selectively output one of an inverted value of the value stored in the first memory and the predetermined fixed value in accordance with a first external control signal; a second MUX to selectively output one of a signal value in the transport stream and an output value of the first MUX in accordance with a second external control signal; a first adder to add an output value of the second MUX to the value stored in the first memory, and store the resultant value of addition in the first memory; a third MUX to selectively output one of the signal value in the transport stream and the value stored in the second memory in accordance with the second external control signal; and a second adder to add an output value of the third MUX to the value stored in the second memory, and store the resultant value of addition in the third memory.

According to another aspect of the present invention the first MUX may select and output the fixed value if it is judged that the present region is a first reset region in accordance with the first external control signal, and select and output the inverted value of the value stored in the first memory if it is judged that the present region is a second reset region that follows the first reset region. The second MUX may select and output the signal value in the transport stream if the second external control signal is the reset signal, and select and output the output value of the first MUX if the second external control signal is a general operation signal. The first adder may perform an exclusive OR of the output value of the second MUX and the value stored in the first memory, and store the resultant value of the exclusive OR in the first memory.

According to another aspect of the present invention the third MUX may select and output the value stored in the second memory if the second external control signal is the reset signal, and the second adder may perform an exclusive OR of the output value of the third MUX and the value stored in the second memory, and store the resultant value of the exclusive OR in the third memory.

According to another aspect of the present invention the fourth or fifth type trellis encoder may have first to third memories, and set the value stored in the first memory to a predetermined first value and set the third memory to zero at a time point where a first signal value among signal values that belong to the region preceding the SRS process is received, while it may set the value stored in the first memory to a predetermined second value and set the second memory to zero at a time point where a second signal value that follows the first signal value is received.

According to another aspect of the present invention the fourth or fifth trellis encoder may include first to third memories; a first MUX to selectively output one of an inverted value of the value stored in the first memory and the value stored in the first memory in accordance with a first external control signal; a second MUX to selectively output one of a signal value in the transport stream and an output value of the first MUX in accordance with a second external control signal; a first adder to add an output value of the second MUX to the value stored in the first memory, and store the resultant value of addition in the first memory; a third MUX to selectively output one of the signal value in the transport stream and the value stored in the second memory in accordance with the second external control signal; and a second adder to add an output value of the third MUX to the value stored in the second memory, and store the resultant value of addition in the third memory.

According to another aspect of the present invention the first MUX included in the fourth type trellis encoder may select and output the inverted value of the value stored in the first memory if it is judged that the present region is a first reset region in accordance with the first external control signal, and select and output the value stored in the first memory if it is judged that the present region is a second reset region that follows the first reset region. The second MUX may select and output the signal value in the transport stream if the second external control signal is the reset signal, and select and output the output value of the first MUX if the second external control signal is a general operation signal. The first adder may perform an exclusive OR of the output value of the second MUX and the value stored in the first memory, and store the resultant value of the exclusive OR in the first memory.

According to another aspect of the present invention the third MUX may select and output the value stored in the second memory if the second external control signal is the reset signal, and the second adder may perform an exclusive OR of the output value of the third MUX and the value stored in the second memory, and store the resultant value of the exclusive OR in the third memory.

According to another aspect of the present invention the first MUX included in the fifth type trellis encoder may select and output the value stored in the first memory if it is judged that the present region is a first reset region in accordance with the first external control signal, and select and output the inverted value of the value stored in the first memory if it is judged that the present region is a second reset region that follows the first reset region. The second MUX may select and output the signal value in the transport stream if the second external control signal is the reset signal, and select and output the output value of the first MUX if the second external control signal is a general operation signal. The first adder may perform an exclusive OR of the output value of the second MUX and the value stored in the first memory, and store the resultant value of the exclusive OR in the first memory.

According to another aspect of the present invention the third MUX may select and output the value stored in the second memory if the second external control signal is the reset signal, and the second adder may perform an exclusive OR of the output value of the third MUX and the value stored in the second memory, and store the resultant value of the exclusive OR in the third memory.

According to another aspect of the present invention the parity compensation unit may include an RS re-encoder to generate parities corresponding to the values stored in the memories in the plurality of trellis encoders; an adder to correct the parities of the transport stream by adding the parities generated by the RS re-encoder to the transport stream; and a MUX to provide the transport stream having the parities corrected by the adder to the plurality of trellis encoders.

According to another aspect of the present invention the trellis encoding device may further include a mapper to perform symbol mapping of the transport stream trellis-encoded by the plurality of trellis encoders.

According to another aspect of the present invention the trellis encoding device may further include a splitter to sequentially output the transport stream provided from the MUX to the plurality of trellis encoders; and an encoding output unit to sequentially detect values encoded by the plurality of trellis encoders to output the detected values to the mapper.

In another aspect of the present invention, there is provided a trellis encoder, which includes first to third memories; a first MUX for selectively operating in accordance with a first external control signal; a second MUX to selectively output one of a specified first signal value in the transport stream and an output value of the first MUX in accordance with a second external control signal; a first adder to add an output value of the second MUX to the value stored in the first memory, and store the resultant value of addition in the first memory; a third MUX to selectively output one of a specified second signal value in the transport stream and the value stored in the second memory in accordance with the second external control signal; and a second adder to add an output value of the third MUX to the value stored in the second memory, and store the resultant value of addition in the third memory.

According to another aspect of the present invention the first MUX may selectively output one of a predetermined fixed value and the value stored in the first memory in accordance with the first external control signal.

According to another aspect of the present invention the first MUX may selectively output one of an inverted value of the value stored in the first memory and a predetermined fixed value in accordance with the first external control signal.

According to another aspect of the present invention the first MUX may selectively output one of an inverted value of the value stored in the first memory and the value stored in the first memory in accordance with the first external control signal.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become and more readily appreciated from the following description of the embodiments, taken in conjunction with the accompanying drawings of which:

FIG. 12 is a view explaining the process of a mapper used in the trellis encoder of FIG. 7.

DETAILED DESCRIPTION OF THE EMBODIMENTS

Figure 1:
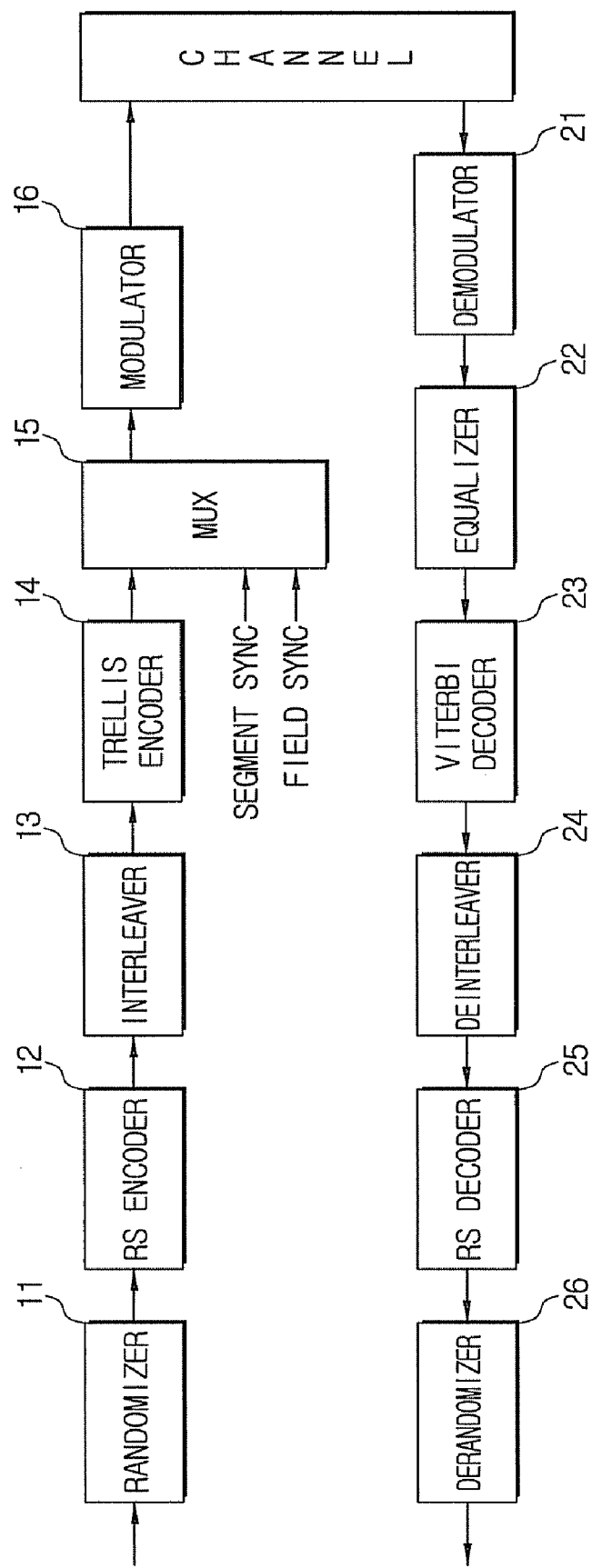
FIG. 1 is a block diagram illustrating the construction of a conventional digital broadcast (ATSC VSB) transmitter/receiver.
Figure 2:
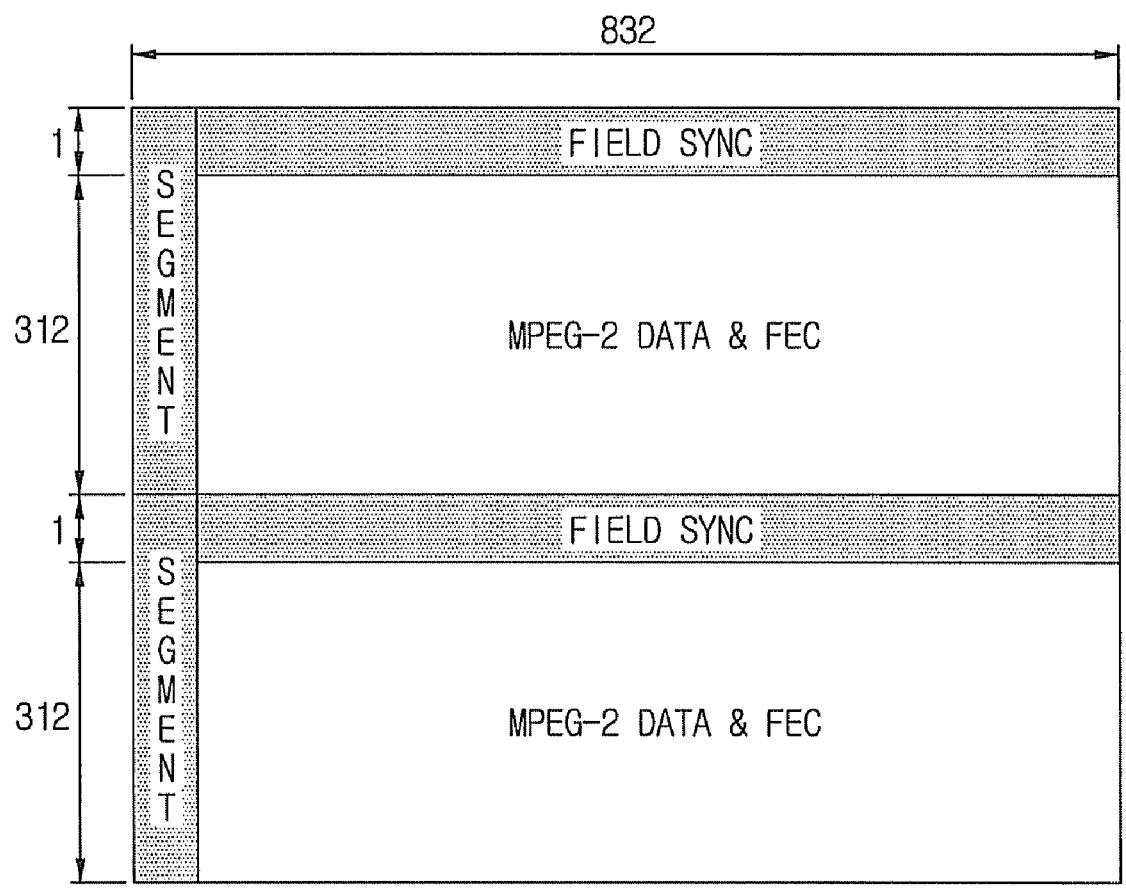
FIG. 2 is an exemplary view illustrating the structure of a conventional ATSC VSB data frame.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3:
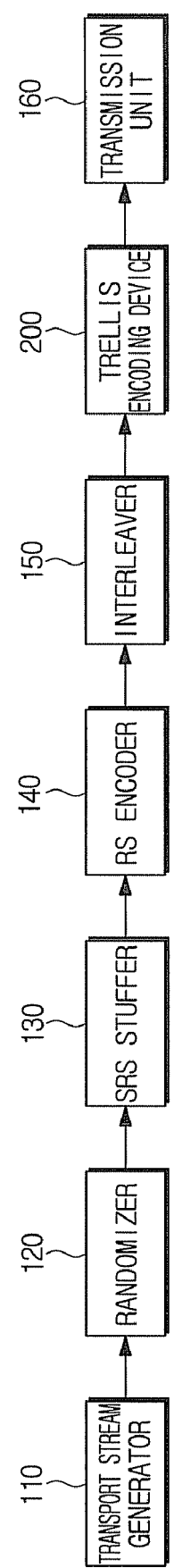
FIG. 3 is a block diagram illustrating the construction of a digital broadcast transmitter adopting a trellis encoding device according to an embodiment of the present invention.

FIG. 3 is a block diagram illustrating the construction of a digital broadcast transmitting system adopting a trellis encoding device according to an embodiment of the present invention. Referring to FIG. 3, the digital broadcast transmitter includes transport stream generator 110, a randomizer 120, a supplementary reference signal (SRS) stuffer 130, a Reed-Solomon (RS) encoder 140, an interleaver 150, a trellis encoding device 200, and a transmission unit 160.

The transport stream generator 110 generates a transport stream to be transmitted to a receiver side. That is, the transport stream generator 110 receives data packets from an external module such as a filming device for broadcasting, a compression processing module such as MPEG-2 module, a video encoder, an audio encoder, and so forth, and constructs a transport stream. In the shown embodiment, the transport stream generator 110 generates an adaptation field that is included in some or all packets in the transport stream. The transport stream generator 110 can write not only a general data stream, but also a turbo stream in some or all packets. The turbo stream refers to a data stream which can include data such as audio data, or other data, that has been compressed according to a specified compression standard and robustly processed. While described in terms of video and/or audio, it is understood that the data packet can include additional data in addition to or instead of the video and/or audio data.

Figure 4:
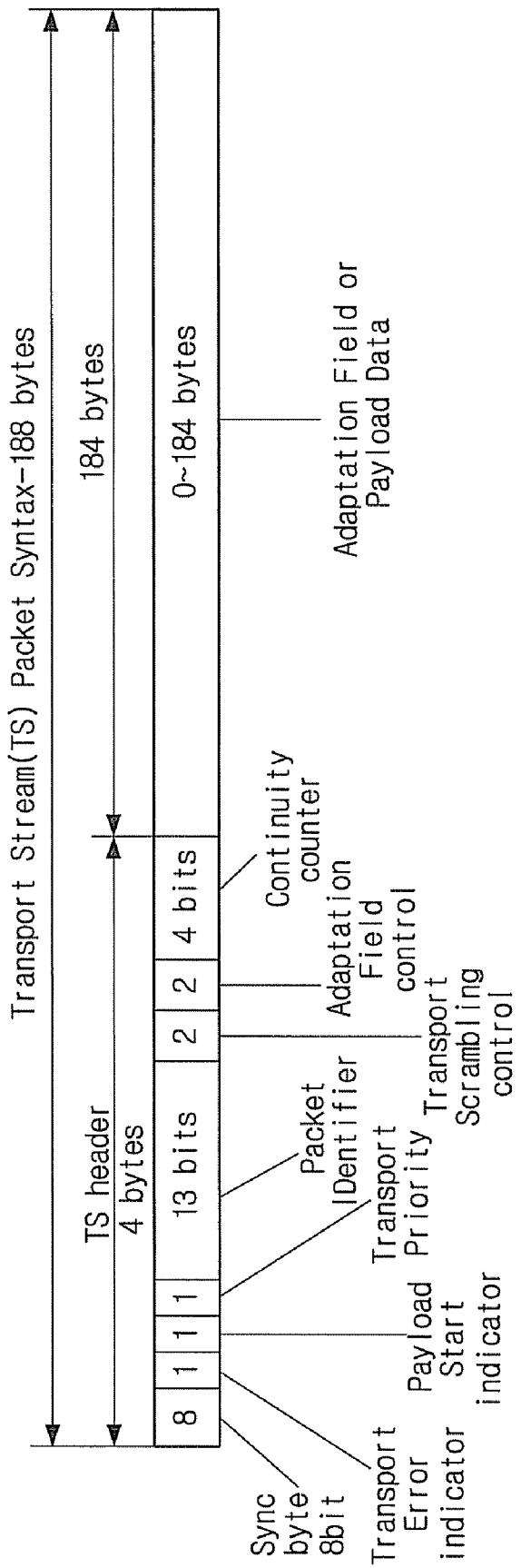
FIGS. 4 to 6 are views illustrating the structure of a packet that is processed in the system of FIG. 3.
Figure 5:
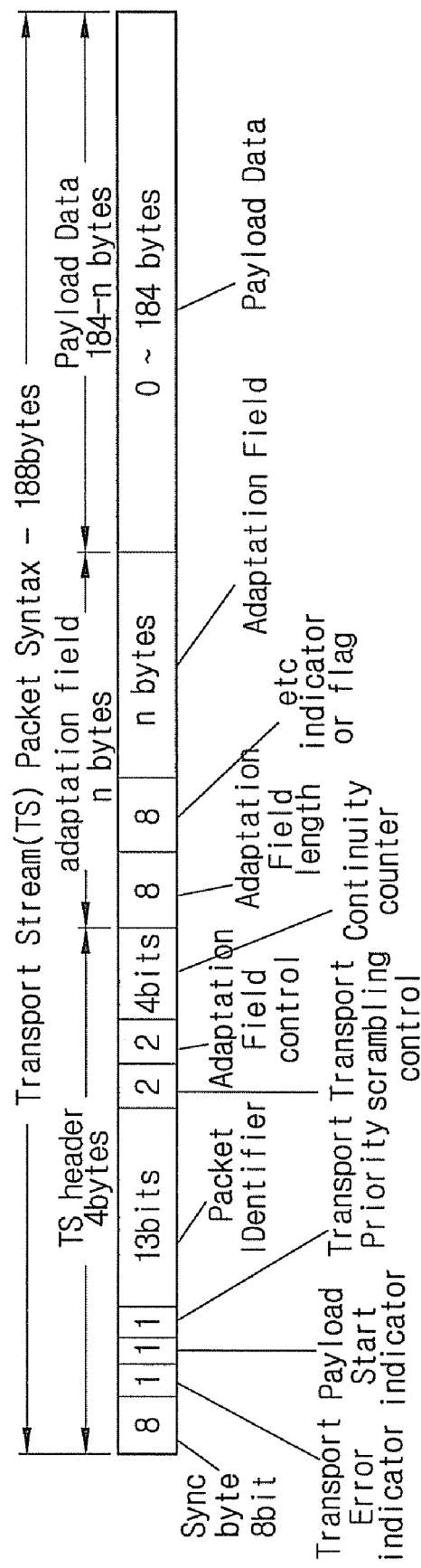

FIGS. 4 and 5 are views illustrating the structure of a transport stream. Referring to FIG. 4, a packet constituting a transport stream is composed of a transport stream (TS) header part and a payload data part. The whole payload data part may also be used as an adaptation field. The TS header part is composed of 4 bytes. In FIG. 4, the shown TS header includes a sync byte, a transport error indicator, a payload start indicator, a transport priority, a packet identifier (ID), a transport scrambling control field, an adaptation field control field, a continuity counter, and so forth. The payload data part is composed of 184 bytes. As such, the TS packet includes 188 bytes.

Referring to FIG. 5, in a packet of a transport stream, an adaptation field is provided in a part of the data region, and payload data may be written in the remaining part of the data region. In this case, if the adaptation field is composed of n bytes, the payload data is composed of 184-n bytes. In the adaptation field, the turbo stream or the SRS may be written.

On the other hand, the transport stream generated by the transport stream generator 110 is randomized by the randomization unit 120, and then transferred to the SRS stuffer 130. The SRS stuffer 130 inserts the SRS into the adaptation field provided in the transport stream. The SRS refers to a signal pattern commonly known between the transmitter side and the receiver side. The receiver side can confirm the channel state by comparing the SRS in the received stream with the known SRS, and determine the degree of compensation.

Figure 6:
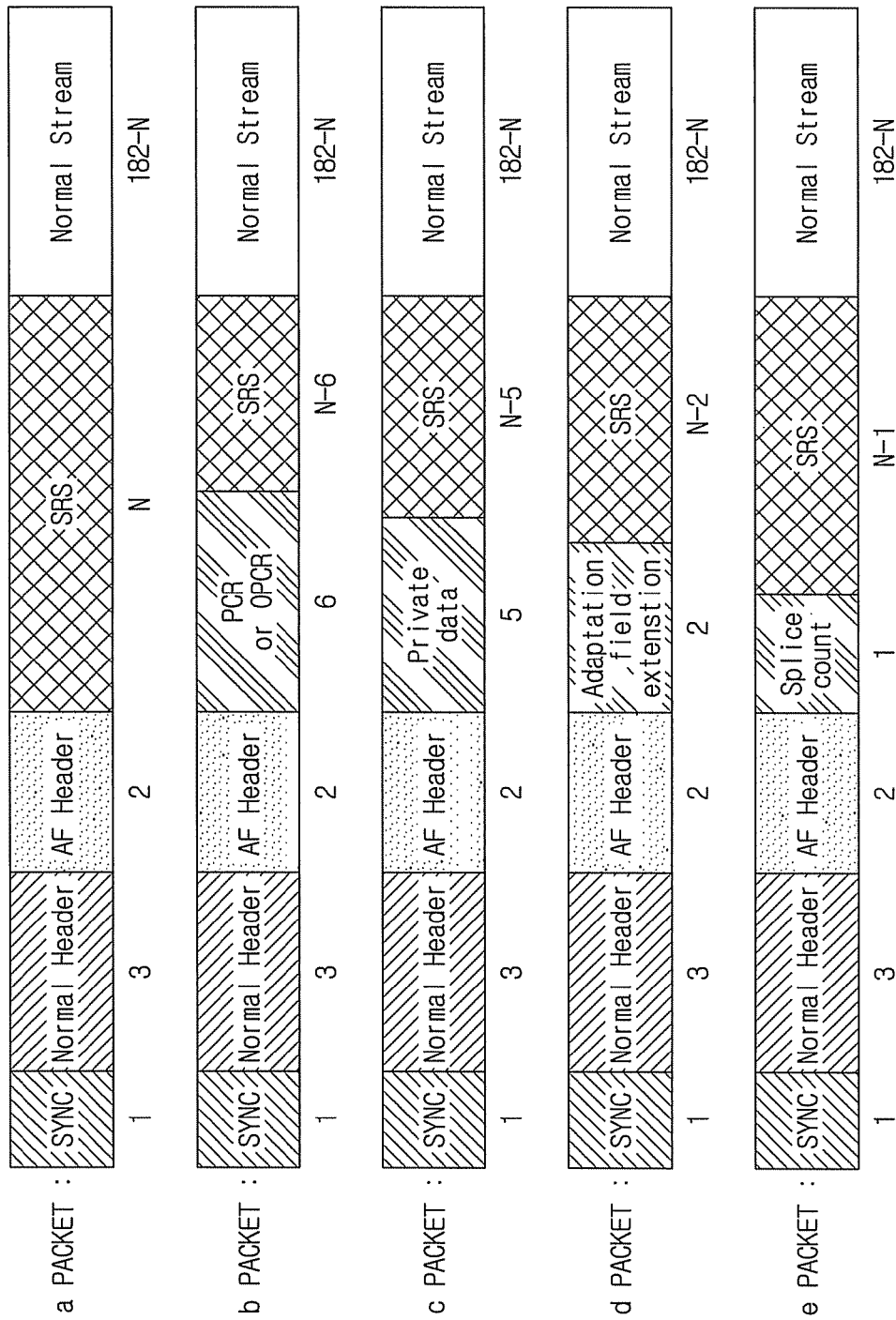

FIG. 6 is a view explaining an adaptation field into which an SRS has been inserted. In FIG. 6, packet "a" is a packet where an SRS has been inserted into the whole data part except for a header part in the adaptation field. Packet "b" is a packet where an SRS has been inserted into a data part of an adaptation field along with a program clock reference (PCR) or an original program clock reference (OPCR). Packet "c", "d", or "e" are packets where an SRS has been inserted into a data part of an adaptation field along with private data, an extended adaptation field, a splice count, and so forth. As described above, diverse kinds of data can be recorded in the adaptation field provided in the transport stream. Such data can be written by the transport stream generator 110.

Figure 7:
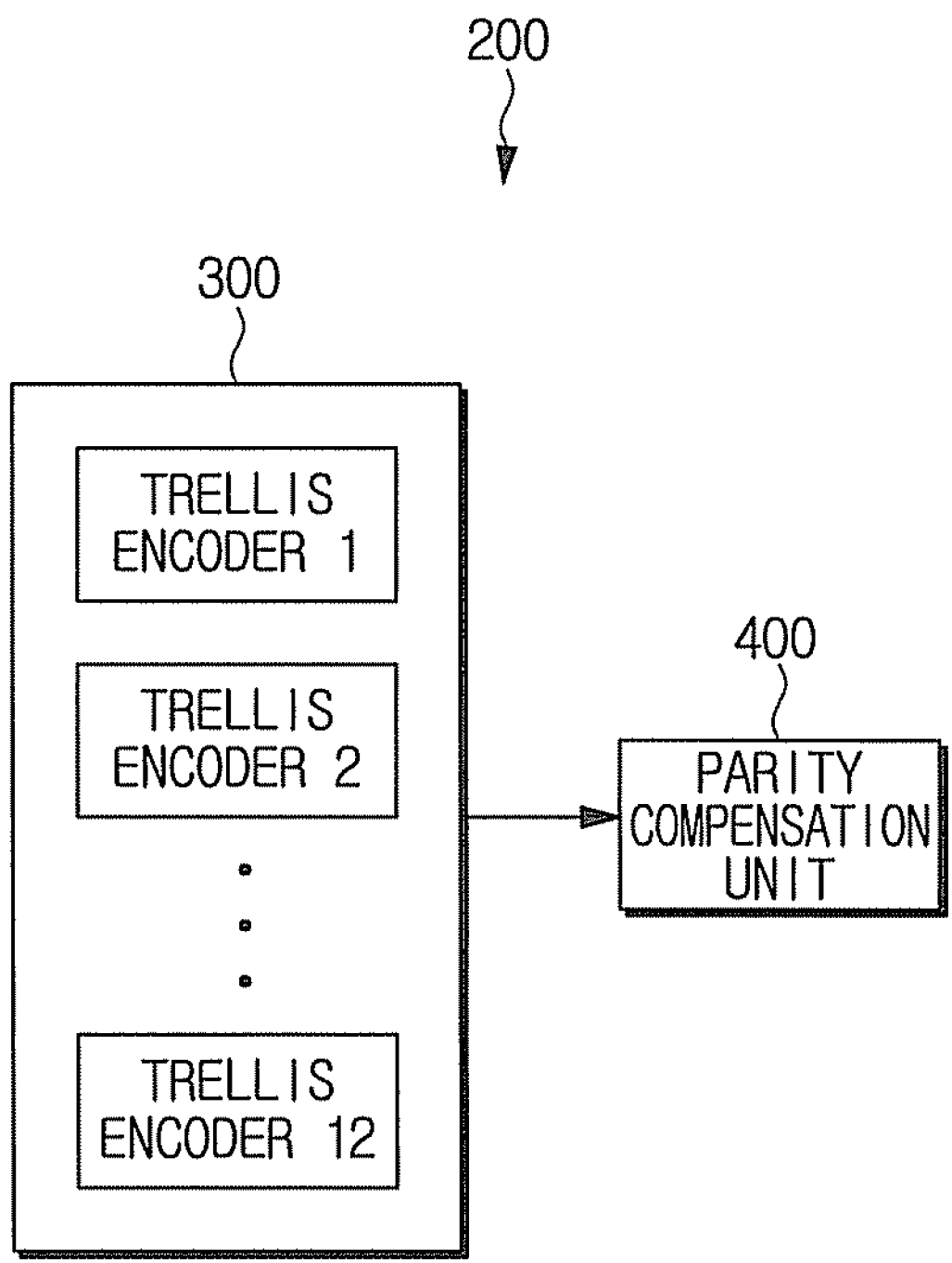
FIG. 7 is a block diagram illustrating the construction of a trellis encoding device according to an embodiment of the present invention.

In addition, the transport stream into which the SRS has been inserted is RS-encoded by the RS encoder 140, and then interleaved by the interleaver 150. Then, the transport stream is trellis-encoded by the trellis encoding device 200. The trellis encoding device 200 performs trellis encoding using a plurality of trellis encoders as shown in FIG. 7. In this embodiment, the trellis encoding device 200 resets memories provided in the respective trellis encoders just before the trellis encoding device 200 processes the part into which the SRS has been inserted.

That is, as described above, the SRS refers to a signal pattern commonly known between the transmitter side and the receiver side. Accordingly, if the SRS is changed in the transmitting process, the receiver side may judge that the channel state is inferior although the transport stream transmission channel state is normal. In the case where the trellis encoding device 200 performs trellis encoding of the SRS part, the SRS part may be affected by values already stored in its own memory, and thus it is required to reset the memory to a specified value before processing the SRS.

The transmission unit 160 serves to transmit the trellis-encoded transport stream through a frequency channel. Specifically, the transmission unit 160 may include a MUX (not illustrated), a modulation unit (not illustrated), and so forth. The MUX multiplexes the trellis-encoded transport stream by adding a segment sync signal and field sync signal to the transport stream. The modulation unit performs channel modulation of the multiplexed transport stream, and performs up-conversion of the modulated signal into an RF channel signal to transmit the converted signal. While described as transmitted as the RF channel signal, it is understood that the transmission can be through other signal types and/or combinations thereof.

FIG. 7 is a block diagram illustrating the construction of a trellis encoding device 200 according to an embodiment of the present invention. Referring to FIG. 7, the trellis encoding device 200 includes a trellis encoder block 300 and a parity compensation unit 400. The trellis encoder block 300 serves to perform trellis encoding of the transport stream using a plurality of trellis encoders. In this case, the trellis encoder block 300 can perform trellis encoding of a packet according to an external control signal, and performs a memory reset just before trellis-encoding the SRS data of the packet. The external control signal can be provided from a controller (not illustrated) separately provided. As shown, the encoder block 300 has twelve (12) trellis encoders. However, it is understood that other numbers of encoders can be used.

The parity compensation unit 400 compensates for parities of the transport stream in accordance with the memory storage values that are outputted in the memory resetting process performed by the trellis encoder block 300.

Figure 8:
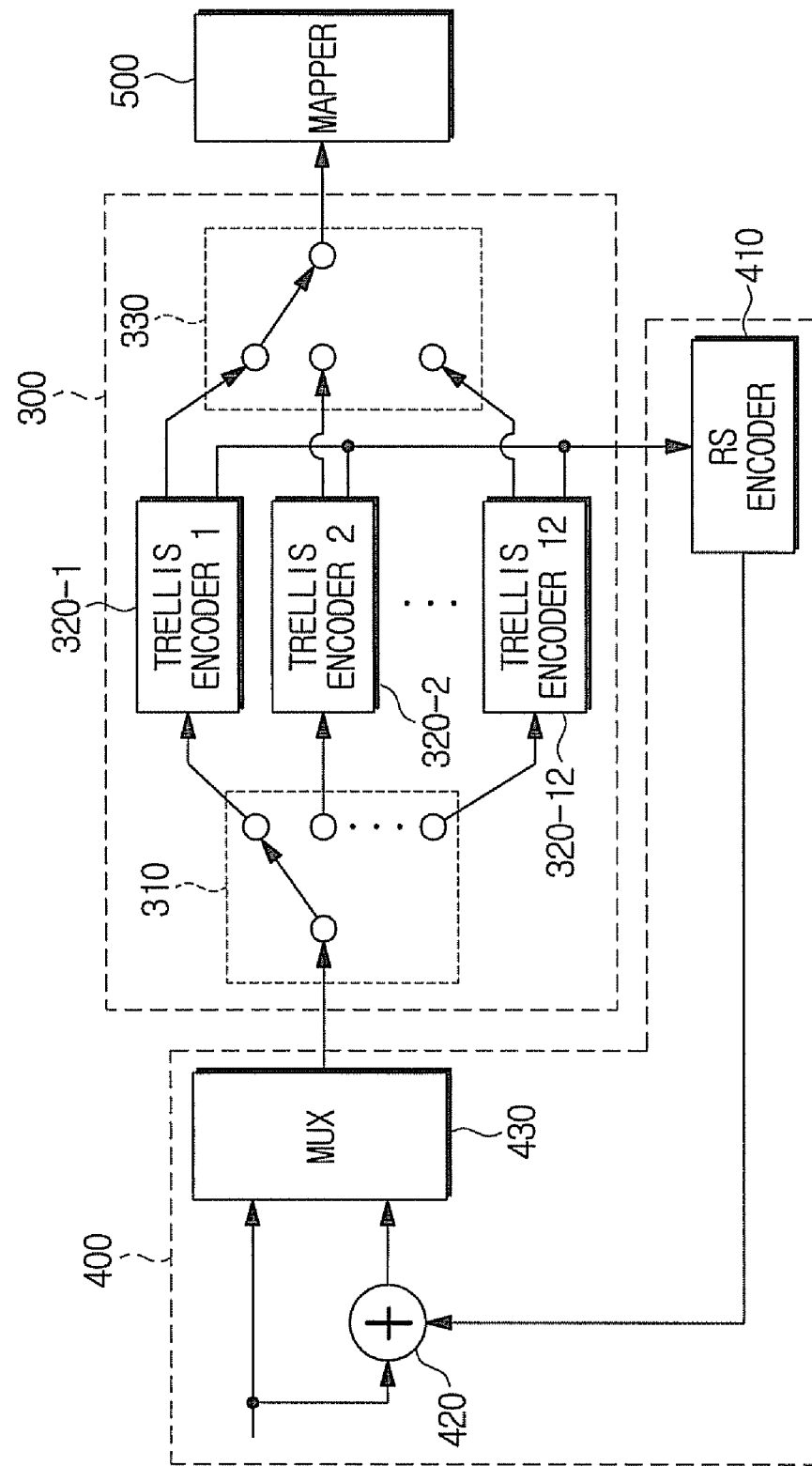
FIG. 8 is a block diagram illustrating the detailed construction of the trellis encoding device of FIG. 7.

FIG. 8 is a block diagram illustrating the detailed construction of the trellis encoding device of FIG. 7. Referring to FIG. 8, the parity compensation unit 400 includes an RS re-encoder 410, an adder 420, and a MUX 430. The trellis encoder block 300 includes a splitter 310, a plurality of trellis encoders 320-1 to 320-12, and an encoding output unit 330. The trellis encoding device 200 further includes a mapper 500.

The RS re-encoder 410 generates parities corresponding to the memory storage values outputted from the respective trellis encoders 320-1 to 320-12. The adder 420 adds the parities generated by the RS re-encoder 410 to the externally inputted packet, and provides the added data to the MUX 430. Here, the adding method is as follows.

A) the former omitted . . . 101001010111 001010101011AAAAA . . . the rest omitted B) the former omitted . . . 000000000000 010000000000BBBBB . . . the rest omitted C) the former omitted . . . 101001010111 011010101011CCCCC . . . the rest omitted A) denotes an externally inputted packet, B) denotes a re-encoded packet, and C) denotes the result of the exclusive OR of A) and B) performed through the adder 420. When the underlined part of packet A) is inputted to the trellis encoder block 300, a memory reset is performed. In this case, the values pre-stored in the memories of the trellis encoder block 300 are provided to the RS re-encoder 410, and the RS re-encoder 410 generates parities corresponding to the provided values and outputs packet B). The underlined part of packet B) refers to the changed value that corresponds to the underlined part of packet A). The parities corresponding to the underlined part of packet B) are regenerated as "BBBBB".

The adder 420 performs an exclusive OR of packet A) and packet B) and outputs packet C). In packet C), the underlined part of packet A) initially inputted is changed to "01", and the parities are also changed from "AAAAA" to "CCCCC".

Also, the MUX 430 can operate in either an operation mode for trellis-encoding the respective packets of the input transport stream (hereinafter referred to as a "typical mode"), or an operation mode for trellis-encoding the packets added by the adder 420 (hereinafter referred to as a "parity correction mode"). The operation mode of the MUX 430 is determined by a control signal received from the RS re-encoder 410.

In the typical mode, the MUX 430 provides the input transport stream to the trellis encoder block 300. In the parity correction mode, the MUX 430 provides the stream outputted from the adder 420 to the trellis encoder block 300. The MUX 430 operates in a typical mode, upon completion of the memory reset and parity compensation, so that the MUX 430 provides the trellis encoder block 300 with the transport stream.

The splitter 310 in the trellis encoder block 300 sequentially outputs the transport stream provided from the MUX 430 to the respective trellis encoders 320-1 to 320-12. In this embodiment, the transport stream can be outputted in the unit of a byte, but the units are not restricted thereto.

The respective trellis encoders 320-1 to 320-12 perform trellis encoding of the input streams to output the trellis-encoded streams. In this embodiment, the trellis encoders 320-1 to 320-12 are sequentially selected to output the trellis-encoded values. Alternately, in the region that precedes the region in which the SRS is positioned (suc as the AF header, the PCR, etc.), the respective trellis encoders 320-1 to 320-12 perform the memory reset. Accordingly, in the region preceding the SRS process, the memories are reset to a specified value, and the compensated parities from the parity compensation unit 400 are added to the transport stream, thereby achieving the coincidence of the whole parities.

The encoding output unit 330 sequentially detects the encoded values outputted from the respective trellis encoders 320-1 to 320-12, and outputs the sequentially detected encoded values to the mapper 500.

The respective trellis encoders 320-1 to 320-12 in the trellis encoder block 300 may be constructed in individual forms, and perform the memory reset in individual ways according to aspects of the invention. That is, if the whole trellis encoders 320-1 to 320-12 have the same construction, the same values are included in the transport stream during the memory reset to cause positive/negative ((+)/(−)) DC offset in the mapping process. Accordingly, by making the memory reset be performed in diverse ways, the DC offset can be removed or reduced.

All of the trellis encoders 320-1 to 320-12 may be classified into first to fifth types. Each trellis encoder 320-1 to 320-12 is provided with three memories, (i.e., first to third memories). Among the three memories, the second and third memories operate together in a shift manner. That is, if a transport stream signal is inputted, the stored value of the third memory is shifted to the second memory. Accordingly, in order to reset all of the memories, two signals are required.

However, the first memory is reset separately from the second and third memories. Accordingly, by inputting a first signal, the first memory can be reset. The above-described types can be classified according to the reset type of the first memory. That is, the first type trellis encoder sets the first and third memories to zero in a first reset region, and then sets the second memory in a second reset region. The first reset region corresponds to a time point where a first signal value that belongs to the region that precedes the SRS process is received, and the second reset region corresponds to a time point where a second signal value that follows the first signal value is received.

The second or third type trellis encoder maintains the value stored in the first memory as is and sets the third memory to zero in the first reset region. The second or third type trellis encoder also sets the value stored in the first memory to a specified value and sets the second memory to zero in the second reset region that follows the first reset region. Here, the specified value may be "0" or "1". That is, the second type trellis encoder sets the first memory to "0" in the second reset region, and the third type trellis encoder sets the first memory to "1" in the second reset region. However, the specified value need not be so limited.

The fourth or fifth type trellis encoder sets the value stored in the first memory to a predetermined first value and sets the third memory to zero in the first reset region. The fourth or fifth type of trellis encoder also sets the value stored in the first memory to a predetermined second value and sets the second memory to zero in the second reset region. Specifically, the fourth type trellis encoder sets the first memory to "1" in the first reset region and sets the first memory to "0" in the second reset region, while the fifth type trellis encoder sets the first memory to "0" in the first reset region and sets the first memory to "1" in the second reset region. However, the specified value need not be so limited.

Figure 9:
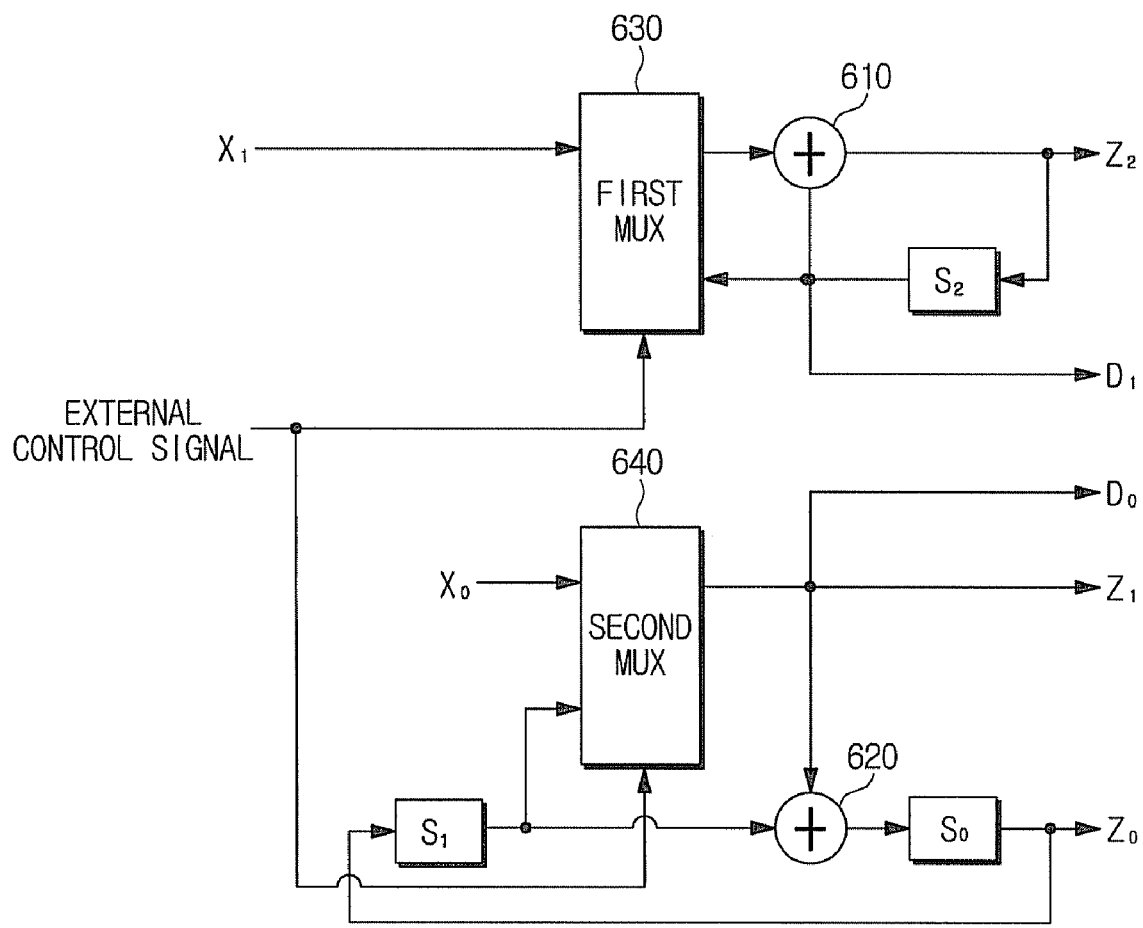
FIGS. 9 to 11 are block diagrams illustrating the construction of a trellis encoder according to diverse embodiments of the present invention.

FIG. 9 is a block diagram illustrating the construction of the first type trellis encoder according to an embodiment of the present invention. Referring to FIG. 9, the first type trellis encoder includes a first memory S2, a second memory S1, a third memory S0, a first adder 610, a second adder 620, a first MUX 630, and a second MUX 640.

The memory reset is determined according to an external control signal, such as one provided from a controller (not shown). Specifically, the control signal "0" or "1" may be inputted to the first or second MUX 630 or 640. The control signal "1" is used as a reset signal, and the control signal "0" is used as a general operation signal. However, it is understood that other symbols can be used for the reset and general operation signals.

The first MUX 630 selectively outputs one of the value stored in the first memory S2 and a signal value X1 in the transport stream according to the external control signal. Specifically, the first MUX 630 outputs the value stored in the first memory S2 when the reset signal (i.e., control signal "1") is inputted, and outputs X1 when the general operation signal (i.e., control signal "0") is inputted. X1 is a signal value provided in a region preceding the SRS process in the transport stream.

The output value of the first MUX 630 is provided to the first adder 610. The first adder 610 adds the output value of the first MUX 630 to the value stored in the first memory S2. The resultant value of addition is outputted as Z2, and is simultaneously stored in the first memory S2.

When control signal "1" is inputted, the first MUX 630 selects and outputs the value stored in the first memory S2. Thus two input values of the first adder 610 become equal to each other. When the first adder 610 performs an exclusive OR, the resultant value of the exclusive OR becomes "0", and the value stored in the first memory S2 is set to zero. In this case, the value D1 previously stored in the first memory S2 is output to the RS re-encoder 410. Accordingly, D1 is used for a parity compensation work according to the memory reset.

Also, the second MUX 640 selectively outputs one of the values stored in the second memory S1 and a signal value X0 in the transport stream according to the external control signal. Specifically, the second MUX 640 outputs the value stored in the second memory S1 when the reset signal is inputted, and outputs X0 when the general operation signal is inputted. X0 is a signal value provided in the region that precedes the SRS process in the transport stream.

The output value of the second MUX 640 is directly outputted as Z1, and is simultaneously provided to the second adder 620. The output value D0 of the second MUX 640 is provided to the RS re-encoder 410 and is used for the parity compensation work according to the memory reset. The value stored in the second memory S1 is directly provided to the second adder 620. The second adder 620 performs the exclusive OR, and when the reset signal is inputted, it outputs "0" as the resultant value of the exclusive OR.

The resultant value of the exclusive OR that is output from the second adder 620 is stored in the third memory S0 as it is. Thus, the third memory S0 is initialized to "0". Simultaneously, the value having been stored in the third memory S0 is shifted to the second memory S1. In addition, the value having been stored in the third memory S0 is output as Z0. As a result, if the initial reset signal is inputted, the first and third memories S2 and S0 are reset to zero, respectively.

If the reset signal is input again in this state, the value stored in the third memory S0 (e.g., "0") is shifted to the second memory S1. Accordingly, the second memory S1 is initialized. Simultaneously, the second MUX 640 outputs the value D0 currently stored in the second memory S1 (e.g., the value stored in the third memory S0 before the initialization).

If the current region is not the initialization region, the first MUX 630 and the second MUX 640 select X1 and X0, respectively, to perform the trellis encoding.

As described above, since three memories S0, S1, and S2 are provided in the first type of trellis encoder, and the values stored in the memories are shifted, control signal "2" symbol is required in order to reset all the memories. Also, there exist eight combinations of D1 and D0, for example, 000, 111, 001, 010, 100, 110, 101, and 011, which can be made using the three memories S0, S1, and S2.

The memory resetting process performed by the first type trellis encoder can be arranged as in Table 1 below.

In Table 1, the term "input" refers to values inputted from the first MUX 630 and the second MUX 640 to the first adder 610 and the second adder 620, respectively. In an initial state (i.e., t=0), the memory reset starts when the external control signal Cont=1 is inputted. Accordingly, at a time point where the first control signal Cont=1 is inputted (i.e., t=1), the first memory S2 and the third memory S0 are set to "0", respectively, irrespective of the values stored in the first and second memories S2 and S0. In addition, at a time point where the second control signal Cont=1 is input (i.e., t=2), the second memory S1 is also set to "0". As described above, referring to Table 1, the memory reset is performed by a two-symbol external control signal.

Figure 10:
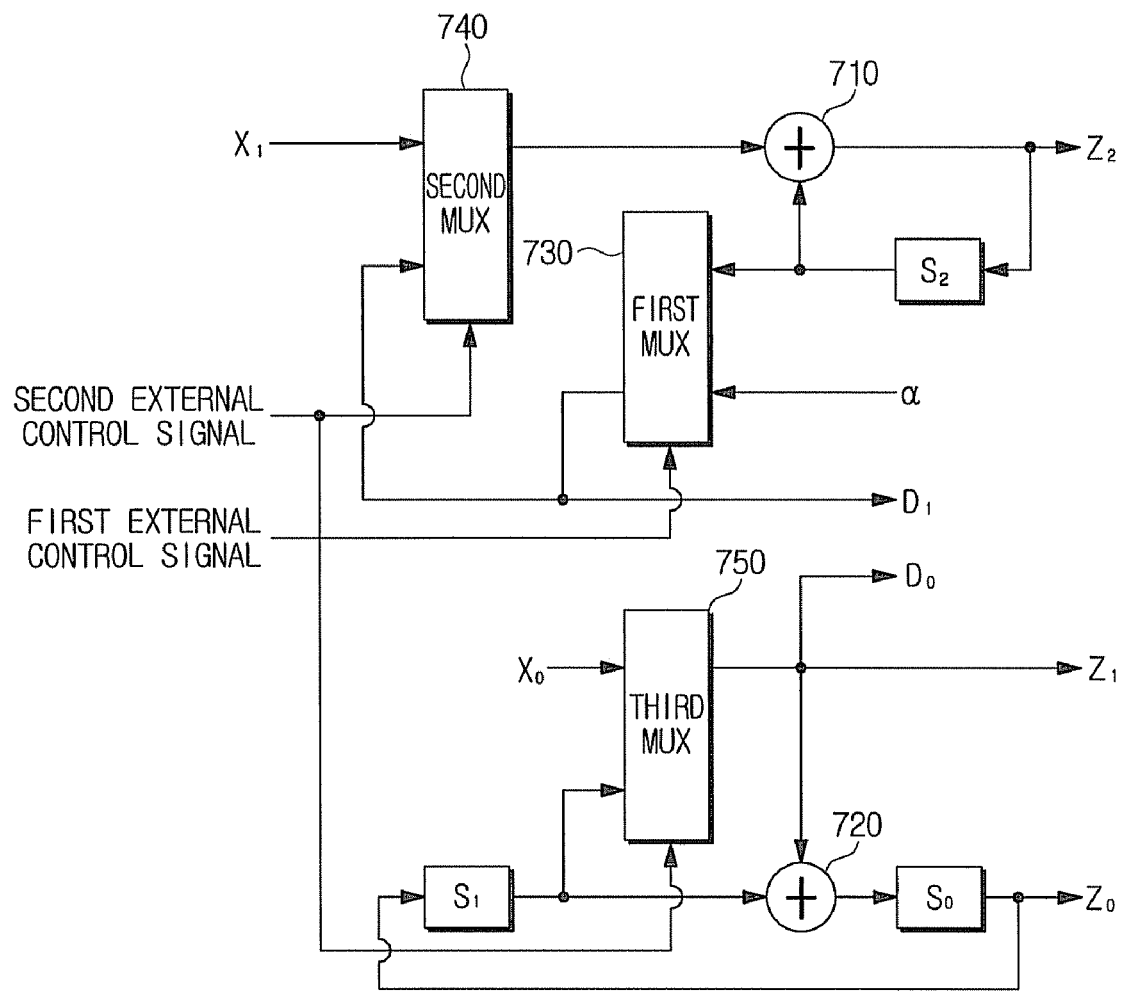

FIG. 10 is a block diagram illustrating the construction of the second or third type trellis encoder according to an embodiment of the present invention. Referring to FIG. 10, the second type trellis encoder includes a first memory S2, a second memory S1, a third memory S0, a first adder 710, a second adder 720, a first MUX 730, a second MUX 740, and a third MUX 750. Since the operation and function of the first to third memories are the same as those as illustrated in FIG. 9, the detailed explanation thereof will be omitted.

The first MUX 730 selectively outputs one of the value stored in the first memory S2 and a value α according to the first external control signal. The value α may be a randomly determined value or a certain fixed value. For example, the value α may be fixed to "0".

The first external control signal is a signal for reporting whether the current memory resetting is performed in the first reset region or the second reset region. In the case where three memories S2, S1, and S0 are provided, at least two control signals are required to reset the memories S2, S1 and S0. The control signals can be provided from a controller (not shown).

Specifically, if the first external control signal is "0", the first MUX 730 judges that the current reset region is the first reset region, and outputs the value α. If the first external control signal is "1", the first MUX 730 judges that the current reset region is the second reset region that follows the first reset region, selects and outputs the value stored in the first memory S2.

If the second external control signal is "0", (i.e., a general operation signal), the second MUX 740 selects and outputs X1. If the second external control signal is "1", (i.e., the reset signal), the second MUX 740 selects and outputs the value outputted from the first MUX 730. The first adder 710 performs an exclusive OR of the value output from the second MUX 740 and the value stored in the first memory S2, and outputs the resultant value of the exclusive OR as Z2 as well as storing the resultant value in the first memory S2.

If the reset signal is inputted in a state that α=0, the resultant value outputted from the first adder 710 becomes equal to the value stored in the first memory S2. Accordingly, in the first reset region, the value of the first memory S2 is main-

TABLE 1

| Cont | S2, S1, S0 at t = 0 | input at t = 1 | Z2, Z1, Z0 at t = 1 | S2, S1, S0 at t = 1 | input at t = 2 | Z2, Z1, Z0 at t = 2 | S2, S1, S0 At t = 2 |
|---|---|---|---|---|---|---|---|
| 1 | 0, 0, 0 | 0, 0 | 000 | 0, 0, 0 | 0, 0 | 000 | 0, 0, 0 |
| 1 | 0, 0, 1 | 0, 0 | 001 | 0, 1, 0 | 0, 1 | 010 | 0, 0, 0 |
| 1 | 0, 1, 0 | 0, 1 | 010 | 0, 0, 0 | 0, 0 | 000 | 0, 0, 0 |
| 1 | 0, 1, 1 | 0, 1 | 011 | 0, 1, 0 | 0, 1 | 010 | 0, 0, 0 |
| 1 | 1, 0, 0 | 1, 0 | 000 | 0, 0, 0 | 0, 0 | 000 | 0, 0, 0 |
| 1 | 1, 0, 1 | 1, 0 | 001 | 0, 1, 0 | 0, 1 | 010 | 0, 0, 0 |
| 1 | 1, 1, 0 | 1, 1 | 010 | 0, 0, 0 | 0, 0 | 000 | 0, 0, 0 |
| 1 | 1, 1, 1 | 1, 1 | 011 | 0, 1, 0 | 0, 1 | 010 | 0, 0, 0 | tained as is. In the second reset region, the value of the first memory S2 is transferred to the first adder 710 through the second MUX 740, and thus the first memory S2 is set to "0".

In the case of the above-described first type trellis encoder, the first memory S2 is set to "0" in the first reset region, and the mapper 500 maps this set value onto one of values −1, −3, −5, and −7. The output of the first type trellis encoder has a specified DC offset through the mapper 500. Accordingly, if the first memory S2 is set to "0" from the first reset region, the DC offset may have a negative value. However, in the case of the second type trellis encoder, the first memory S2 is set to "0" in the second reset region, and thus the DC offset can be reduced in comparison to the first type trellis encoder.

The memory resetting process performed by the second type trellis encoder can be arranged as in Table 2 below. In Table 2, at the time point where t=0, the value stored in the first memory S2 is maintained as is, and at the time point where t=2, the value stored in the first memory S2 is set to "0".

TABLE 2

| Cont | S2, S1, S0 at t = 0 | input at t = 1 | Z2, Z1, Z0 at t = 1 | S2, S1, S0 at t = 1 | input at t = 2 | Z2, Z1, Z0 at t = 2 | S2, S1, S0 at t = 2 |
|---|---|---|---|---|---|---|---|
| 1 | 0, 0, 0 | 0, 0 | 000 | 0, 0, 0 | 0, 0 | 000 | 0, 0, 0 |
| 1 | 0, 0, 1 | 0, 0 | 001 | 0, 1, 0 | 0, 1 | 010 | 0, 0, 0 |
| 1 | 0, 1, 0 | 0, 1 | 010 | 0, 0, 0 | 0, 0 | 000 | 0, 0, 0 |
| 1 | 0, 1, 1 | 0, 1 | 011 | 0, 1, 0 | 0, 1 | 010 | 0, 0, 0 |
| 1 | 1, 0, 0 | 0, 0 | 100 | 1, 0, 0 | 1, 0 | 000 | 0, 0, 0 |
| 1 | 1, 0, 1 | 0, 0 | 101 | 1, 1, 0 | 1, 1 | 010 | 0, 0, 0 |
| 1 | 1, 1, 0 | 0, 1 | 110 | 1, 0, 0 | 1, 0 | 000 | 0, 0, 0 |
| 1 | 1, 1, 1 | 0, 1 | 111 | 1, 1, 0 | 1, 1 | 010 | 0, 0, 0 |

The setting operation of the second and third memories S1 and S0 are the same as that of the first type trellis encoder shown in FIG. 9. That is, the operations of the third MUX 750 and the second adder 720 as illustrated in FIG. 10 are the same as those of the second MUX 640 and the second adder 620 of the first type trellis encoder as illustrated in FIG. 9, and thus the repeated explanation thereof will be omitted.

Also, the third type trellis encoder may be implemented by adding an inverter to a part that receives the value stored in the first memory S2 in the first MUX 730 as shown in FIG. 10. In this embodiment, an inverted value of the stored value of the first memory S2 is output in the second reset region. Accordingly, the value outputted through the second MUX 740 in the second reset period becomes the inverted value of the first memory S2. As a result, by performing an exclusive OR through the first adder 710, the first memory S2 is set to "1". This can be arranged as in Table 3 below.

illustrated in FIG. 10 except for the input terminal part of the first MUX 730, the detailed explanation thereof will be omitted.

The third type trellis encoder has the value finally set in the first memory S2 which is different from the value set in the first memory of the second type trellis encoder. Accordingly, by implementing the trellis encoder block 300 by properly combining the second and third type trellis encoders, the DC offset can be removed or reduced.

Figure 11:
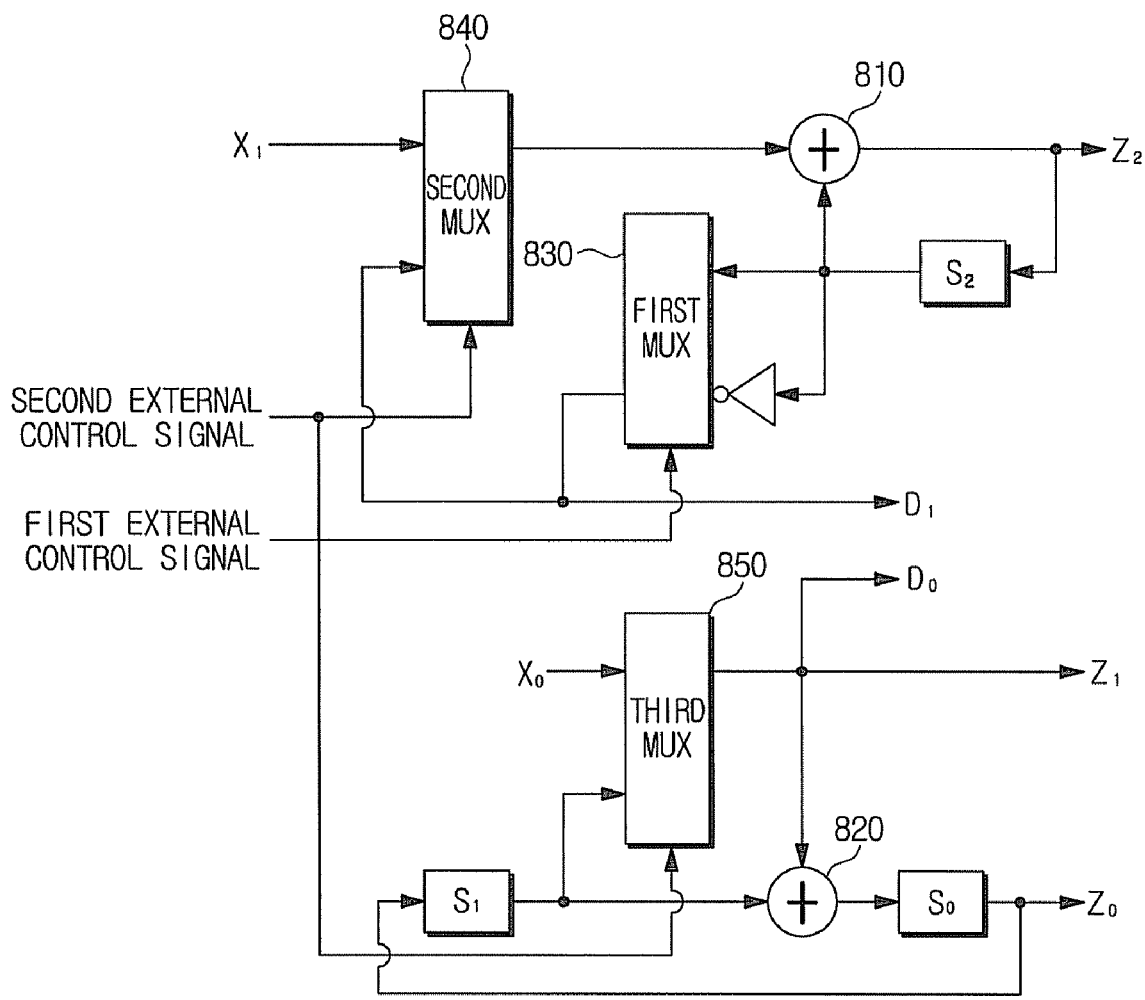

FIG. 11 is a block diagram illustrating the construction of the fourth or fifth type trellis encoder according to an embodiment of the present invention. Referring to FIG. 11, the fourth or fifth type trellis encoder includes a first to third memories S2, S1, and S0, a first adder 810, a second adder 820, a first MUX 830, a second MUX 840, and a third MUX 850. The first MUX 830 selectively outputs one of the value stored in the first memory S2 and an inverted value of the stored value according to the first external control signal.

Specifically, in the case of the fourth type trellis encoder, the first MUX 830 outputs the inverted value of the stored value of the first memory S2 if the first external control signal is a signal for reporting the first reset region. By contrast, if the first external control signal is a signal for reporting the second reset region, the first MUX 830 selects and outputs the stored value of the first memory S2. The second MUX 840 selects and outputs the output value of the first MUX 830 if the second external control signal is a reset signal, while the second MUX 840 selects and outputs X1 if the second external control signal is a general operation signal.

In the first reset region, the inverted value of the stored value of the first memory S2 and the stored value of the first memory S2 are exclusive-OR-gated by the first adder 810, and the resultant value of the exclusive OR always becomes

TABLE 3

| Cont | S2, S1, S0 at t = 0 | Input at t = 1 | Z2, Z1, Z0 at t = 1 | S2, S1, S0 at t = 1 | input at t = 2 | Z2, Z1, Z0 at t = 2 | S2, S1, S0 at t = 2 |
|---|---|---|---|---|---|---|---|
| 1 | 0, 0, 0 | 0, 0 | 000 | 0, 0, 0 | 1, 0 | 100 | 1, 0, 0 |
| 1 | 0, 0, 1 | 0, 0 | 001 | 0, 1, 0 | 1, 1 | 110 | 1, 0, 0 |
| 1 | 0, 1, 0 | 0, 1 | 010 | 0, 0, 0 | 1, 0 | 100 | 1, 0, 0 |
| 1 | 0, 1, 1 | 0, 1 | 011 | 0, 1, 0 | 1, 1 | 110 | 1, 0, 0 |
| 1 | 1, 0, 0 | 0, 0 | 100 | 1, 0, 0 | 0, 0 | 100 | 1, 0, 0 |
| 1 | 1, 0, 1 | 0, 0 | 101 | 1, 1, 0 | 0, 1 | 110 | 1, 0, 0 |
| 1 | 1, 1, 0 | 0, 1 | 110 | 1, 0, 0 | 0, 0 | 100 | 1, 0, 0 |
| 1 | 1, 1, 1 | 0, 1 | 111 | 1, 1, 0 | 0, 1 | 110 | 1, 0, 0 |

In Table 3, at the time point where t=1, the value stored in the first memory S2 is maintained as is, and at the time point where t=2, the value stored in the first memory S2 is set to "1". Since the construction of the third type trellis encoder is generally the same as that of the second trellis encoder as "1". Accordingly, the values of Z2 and S2 always become "0" in the first reset region. By contrast, the values of Z2 and S2 always become "0" in the second reset region. The memory resetting process performed by the fourth type trellis encoder can be arranged as in Table 4 below.

TABLE 4

| Cont | S2, S1, S0 at t = 0 | input at t = 1 | Z2, Z1, Z0 at t = 1 | S2, S1, S0 at t = 1 | input at t = 2 | Z2, Z1, Z0 at t = 2 | S2, S1, S0 at t = 2 |
|---|---|---|---|---|---|---|---|
| 1 | 0, 0, 0 | 1, 0 | 100 | 1, 0, 0 | 1, 0 | 000 | 0, 0, 0 |
| 1 | 0, 0, 1 | 1, 0 | 101 | 1, 1, 0 | 1, 1 | 010 | 0, 0, 0 |
| 1 | 0, 1, 0 | 1, 1 | 110 | 1, 0, 0 | 1, 0 | 000 | 0, 0, 0 |
| 1 | 0, 1, 1 | 1, 1 | 111 | 1, 1, 0 | 1, 1 | 010 | 0, 0, 0 |
| 1 | 1, 0, 0 | 0, 0 | 100 | 1, 0, 0 | 0, 0 | 000 | 0, 0, 0 |
| 1 | 1, 0, 1 | 0, 0 | 101 | 1, 1, 0 | 0, 1 | 010 | 0, 0, 0 |
| 1 | 1, 1, 0 | 0, 1 | 110 | 1, 0, 0 | 0, 0 | 000 | 0, 0, 0 |
| 1 | 1, 1, 1 | 0, 1 | 111 | 1, 1, 0 | 0, 1 | 010 | 0, 0, 0 |

In Table 4, at the time point where t=0, the value stored in the first memory S2 is fixed to "1", and at the time point where t=2, it is set to "0".

In the case of the fifth type trellis encoder, the first MUX 830 outputs the stored value of the first memory S2 if the first external control signal is the signal for reporting the first reset region. By contrast, if the first external control signal is the signal for reporting the second reset region, the first MUX 830 selects and outputs the inverted value of the stored value of the first memory S2. The second MUX 840 selects and outputs the output value of the first MUX 830 if the second external control signal is the reset signal, while it selects and outputs X1 if the second external control signal is the general operation signal.

In the first reset region, the stored value of the first memory S2 and the stored value of the first memory S2 are exclusive-OR-gated by the first adder 810, and the resultant value of the exclusive OR always becomes "0". Accordingly, the values of Z2 and S2 in the first reset region always become "0" irrespective of the initial stored value of the first memory S2. By contrast, the values of Z2 and S2 always become "1" in the second reset region. The memory resetting process performed by the fifth type trellis encoder can be arranged as in Table 5 below.

TABLE 5

| Cont | S2, S1, S0 at t = 0 | input at t = 1 | Z2, Z1, Z0 at t = 1 | S2, S1, S0 at t = 1 | input at t = 2 | Z2, Z1, Z0 at t = 2 | S2, S1, S0 at t = 2 |
|---|---|---|---|---|---|---|---|
| 1 | 0, 0, 0 | 0, 0 | 000 | 0, 0, 0 | 1, 0 | 000 | 1, 0, 0 |
| 1 | 0, 0, 1 | 0, 0 | 001 | 0, 1, 0 | 1, 1 | 010 | 1, 0, 0 |
| 1 | 0, 1, 0 | 0, 1 | 010 | 0, 0, 0 | 1, 0 | 000 | 1, 0, 0 |
| 1 | 0, 1, 1 | 0, 1 | 011 | 0, 1, 0 | 1, 1 | 010 | 1, 0, 0 |
| 1 | 1, 0, 0 | 1, 0 | 000 | 0, 0, 0 | 0, 0 | 000 | 1, 0, 0 |
| 1 | 1, 0, 1 | 1, 0 | 001 | 0, 1, 0 | 0, 1 | 010 | 1, 0, 0 |
| 1 | 1, 1, 0 | 1, 1 | 010 | 0, 0, 0 | 0, 0 | 000 | 1, 0, 0 |
| 1 | 1, 1, 1 | 1, 1 | 011 | 0, 1, 0 | 0, 1 | 010 | 1, 0, 0 |

In the case of the fourth or fifth type trellis encoder, the selected value is changed according to the first external control signal, and thus the set value of the first memory S2 is also changed. Accordingly, in the same manner as the second or third type trellis encoder, by properly combining the fourth and fifth type trellis encoders, the DC offset can be offset or reduced.

Since the operation of the third MUX 750 or 850 as illustrated in FIGS. 10 and 11 is generally the same as that of the second MUX 640 or the second adder 620 of the first type trellis encoder as illustrated in FIG. 9, the duplicated explanation thereof will be omitted.

FIG. 12 is a view explaining the process of the mapper 500 that can be used in the trellis encoder of FIG. 8. Referring to FIG. 12, the mapper 500 outputs a value R corresponding to the combination of Z2, Z1, and Z0. For example, if Z2, Z1, and Z0 are "0", "1", and "0", respectively, the mapper 500 outputs a value of −3.

The trellis encoder block 300 of FIG. 8 may be designed to include trellis encoders corresponding to one type of the first to fifth type trellis encoders so that the output value of the mapper 300 is not deviated to the negative or positive value. That is, the trellis encoder block 300 may include all or a part of the first to fifth type trellis encoders.

In a state that the mapping has been performed by the mapper 500, the DC offset of the respective type trellis encoder can be calculated. This DC offset may be calculated on the assumption that all the possible combinations of S2, S1, and S0 are made once.

First, the first type trellis encoder adds all the mapping values corresponding to the values of Z2, Z1, and Z0 outputted in the first reset region, and outputs −32 as the resultant value of addition. Then, the first type trellis encoder adds all the mapping values corresponding to the values of Z2, Z1, and Z0 outputted in the second reset region, and outputs −40 as the resultant value of addition. Accordingly, the total DC offset of −72 is produced.

In the same manner, the second type trellis encoder outputs zero in the first reset region, and outputs −40 in the second reset region. Accordingly, the total DC offset of −40 is produced. In the case of the third type trellis encoder, the DC offset of +24 is produced, and in the case of the fourth type trellis encoder, the DC offset of −8 is produced. In the case of the fifth type trellis encoder, the DC offset of −8 is produced. Using these resultant values of calculation, the number of the respective type trellis encoders can be determined. For example, in the case of implementing the trellis encoder block 300 using three third-type trellis encoders and nine fourth or fifth-type trellis encoders, the resultant value of calculation becomes 24*3−8*9=0, and thus it can be considered that the DC offset has been offset.

Figure 13:
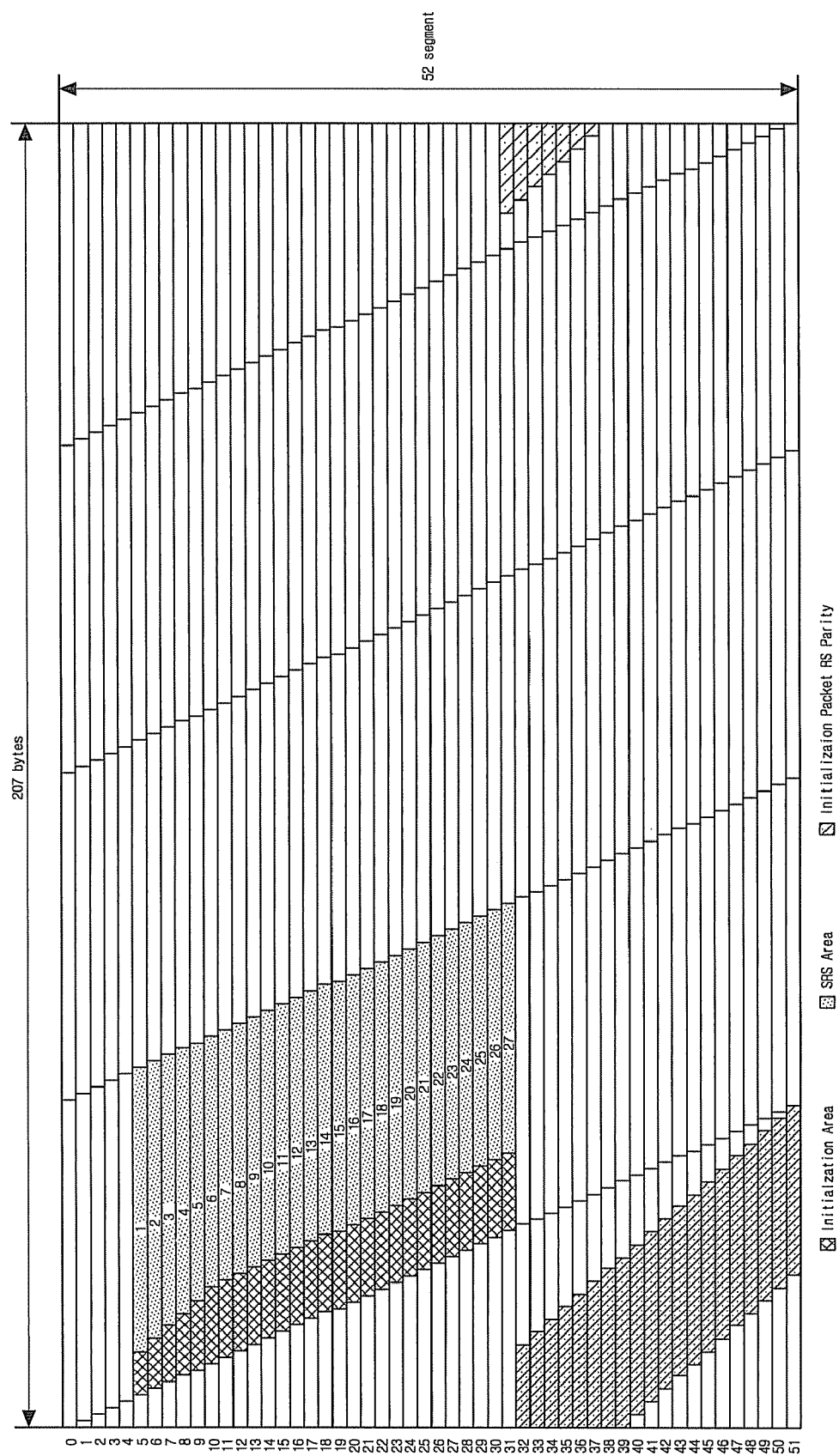
FIG. 13 is a view illustrating an example of the structure of a transport stream including a supplementary reference signal.

FIG. 13 is a view illustrating an example of the structure of a transport stream including a supplementary reference signal. Referring to FIG. 13, it can be seen that the SRS regions have been dispersed by the interleaving. Also, before the respective SRS regions, initialization regions for the memory reset and regions in which compensated parities are written in the case where the parity compensation according to the memory reset is performed are prepared.

As described above, according to an aspect of the present invention, in transmitting the transport stream into which the SRS has been inserted, distortion of the SRS can be prevented by resetting the memories in the trellis encoders. In particular, by setting the stored values of the memories in the trellis encoders to diverse values, the DC offset due to the memory reset can be offset or reduced.

While described in terms of transmission through the channel, it is understood that the trellis encoded signal can be recorded on a recording medium for delayed playback in addition to or instead of transmission through the RF signal Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A trellis encoding device for use with a transport stream comprising a supplemental reference signal (SRS) used by a receiving device to confirm a channel state, and a region preceding a SRS signal insertion region, the device comprising:
a plurality of trellis encoders to perform trellis-encoding of the transport stream into which the SRS signal has been inserted, and perform a memory reset in the region that precedes the SRS insertion region; and
a parity compensation unit to compensate for parities of the transport stream due to the SRS in accordance with values stored in memories included in the trellis encoders.

2. The trellis encoding device of claim 1, wherein the trellis encoders comprise at least one type of trellis encoder amongst five types of trellis encoders.

3. The trellis encoding device of claim 2, wherein the first type trellis encoder has first to third memories, and sets the first to third memories to zero at a time point where a first signal value that belongs to the region preceding the SRS insertion region is received.

4. The trellis encoding device of claim 2, wherein the first type trellis encoder comprises:
first to third memories;
a first MUX to selectively output one of a signal value in the transport stream and a value stored in the first memory in accordance with a received external control signal;
a first adder to add an output value of the first MUX to the value stored in the first memory, and store the resultant value in the first memory;
a second MUX to selectively output one of a signal value in the transport stream and a value stored in the second memory in accordance with the received external control signal; and
a second adder to add an output value of the second MUX to the value stored in the second memory, and store the resultant value in the third memory.

5. The trellis encoding device of claim 4, wherein
the first MUX selects and outputs the value stored in the first memory if the external control signal is a reset signal; and
the first adder performs an exclusive OR of the output value of the first MUX and the value stored in the first memory, and stores the resultant value of the exclusive OR in the first memory.

6. The trellis encoding device of claim 5, wherein the second MUX selects and outputs the value stored in the second memory if the external control signal is the reset signal; and
the second adder performs an exclusive OR of the output value of the second MUX and the value stored in the second memory, and stores the resultant value of the exclusive OR in the third memory.

7. The trellis encoding device of claim 2, wherein each of the second and third type trellis encoder has first to third memories, maintains the value stored in the first memory as is, and sets the third memory to zero at a time point where a first signal value among signal values that belong to the region preceding the SRS insertion region is received, and sets the first memory to a specified value and set the second memory to zero at a time point where a second signal value that follows the first signal value is received.

8. The trellis encoding device of claim 2, wherein the second type trellis encoder comprises:
first to third memories;
a first MUX to selectively output one of a predetermined fixed value and a value stored in the first memory in accordance with a first external control signal;
a second MUX to selectively output one of a signal value in the transport stream and an output value of the first MUX in accordance with a second external control signal;
a first adder to add an output value of the second MUX to the value stored in the first memory, and store the resultant value in the first memory;
a third MUX to selectively output one of the signal value in the transport stream and the value stored in the second memory in accordance with the second external control signal; and
a second adder to add an output value of the third MUX to the value stored in the second memory, and store the resultant value in the third memory.

9. The trellis encoding device of claim 8, wherein the first MUX selects and outputs the fixed value if judged that a present region is a first reset region in accordance with the first external control signal, and selects and outputs the value stored in the first memory if judged that the present region is a second reset region that follows the first reset region;
the second MUX selects and outputs the signal value in the transport stream if the second external control signal is the reset signal, and selects and outputs the output value of the first MUX if the second external control signal is a general operation signal; and
the first adder performs an exclusive OR of the output value of the second MUX and the value stored in the first memory, and stores the resultant value of the exclusive OR in the first memory.

10. The trellis encoding device of claim 9, wherein the third MUX selects and outputs the value stored in the second memory if the second external control signal is the reset signal; and
the second adder performs an exclusive OR of the output value of the third MUX and the value stored in the second memory, and stores the resultant value of the exclusive OR in the third memory.

11. The trellis encoding device of claim 2, wherein the third type trellis encoder comprises:
first to third memories;
a first MUX to selectively output one of an inverted value of the value stored in the first memory and a predetermined fixed value in accordance with a first external control signal;

a second MUX to selectively output one of a signal value in the transport stream and an output value of the first MUX in accordance with a second external control signal;

a first adder to add an output value of the second MUX to the value stored in the first memory, and store the resultant value in the first memory;

a third MUX to selectively output one of the signal value in the transport stream and the value stored in the second memory in accordance with the second external control signal; and a second adder to add an output value of the third MUX to the value stored in the second memory, and store the resultant value in the third memory.

12. The trellis encoding device of claim 11, wherein the first MUX selects and outputs the fixed value if judged that the present region is a first reset region in accordance with the first external control signal, and selects and outputs the inverted value of the value stored in the first memory if judged that the present region is a second reset region that follows the first reset region;

the second MUX selects and outputs the signal value in the transport stream if the second external control signal is the reset signal, and selects and outputs the output value of the first MUX if the second external control signal is a general operation signal; and the first adder performs an exclusive OR of the output value of the second MUX and the value stored in the first memory, and stores the resultant value of the exclusive OR in the first memory.

13. The trellis encoding device of claim 12, wherein the third MUX selects and outputs the value stored in the second memory if the second external control signal is the reset signal; and the second adder performs an exclusive OR of the output value of the third MUX and the value stored in the second memory, and stores the resultant value of the exclusive OR in the third memory.

14. The trellis encoding device of claim 2, wherein each of the fourth and fifth type trellis encoders has first to third memories, sets the value stored in the first memory to a predetermined first value and set the third memory to zero at a time point where a first signal value among signal values that belong to the region preceding the SRS process is received, and sets the value stored in the first memory to a predetermined second value and sets the second memory to zero at a time point where a second signal value that follows the first signal value is received.

15. The trellis encoding device of claim 2, wherein each of the fourth and fifth trellis encoders comprises:

first to third memories;

a first MUX to selectively output one of an inverted value of the value stored in the first memory and the value stored in the first memory in accordance with a first external control signal;

a second MUX to selectively output one of a signal value in the transport stream and an output value of the first MUX in accordance with a second external control signal;

a first adder to add an output value of the second MUX to the value stored in the first memory, and store the resultant value in the first memory;

a third MUX to selectively output one of the signal value in the transport stream and the value stored in the second memory in accordance with the second external control signal; and a second adder to add an output value of the third MUX to the value stored in the second memory, and store the resultant value in the third memory.

16. The trellis encoding device of claim 15, wherein the first MUX included in the fourth type trellis encoder selects and outputs the inverted value of the value stored in the first memory if the present region is a first reset region in accordance with the first external control signal, and selects and outputs the value stored in the first memory if the present region is a second reset region that follows the first reset region;

the second MUX selects and outputs the signal value in the transport stream if the second external control signal is the reset signal, and selects and outputs the output value of the first MUX if the second external control signal is a general operation signal; and the first adder performs an exclusive OR of the output value of the second MUX and the value stored in the first memory, and stores the resultant value of the exclusive OR in the first memory.

17. The trellis encoding device of claim 16, wherein the third MUX selects and outputs the value stored in the second memory if the second external control signal is the reset signal; and the second adder performs an exclusive OR of the output value of the third MUX and the value stored in the second memory, and stores the resultant value of the exclusive OR in the third memory.

18. The trellis encoding device of claim 15, wherein the first MUX included in the fifth type trellis encoder selects and outputs the value stored in the first memory if the present region is a first reset region in accordance with the first external control signal, and selects and outputs the inverted value of the value stored in the first memory if the present region is a second reset region that follows the first reset region;

the second MUX selects and outputs the signal value in the transport stream if the second external control signal is the reset signal, and selects and outputs the output value of the first MUX if the second external control signal is a general operation signal; and the first adder performs an exclusive OR of the output value of the second MUX and the value stored in the first memory, and stores the resultant value of the exclusive OR in the first memory.

19. The trellis encoding device of claim 18, wherein the third MUX selects and outputs the value stored in the second memory if the second external control signal is the reset signal; and the second adder performs an exclusive OR of the output value of the third MUX and the value stored in the second memory, and stores the resultant value of the exclusive OR in the third memory.

20. The trellis encoding device of any one of claim 1, wherein the parity compensation unit comprises:

a Reed-Solomon (RS) re-encoder to generate parities corresponding to the values stored in the memories in the plurality of trellis encoders;

an adder to correct the parities of the transport stream by adding the parities generated by the RS re-encoder to the transport stream; and a MUX to provide the transport stream having the parities corrected by the adder to the plurality of trellis encoders.

21. The trellis encoding device of claim 20, further comprising a mapper to perform symbol mapping of the transport stream trellis-encoded by the plurality of trellis encoders.

22. The trellis encoding device of claim 20, further comprising:
- a splitter to sequentially output the transport stream provided from the MUX to the plurality of trellis encoders; and
- an encoding output unit to sequentially detect values encoded by the plurality of trellis encoders to output the detected values to the mapper.

23. A trellis encoding device comprising:
- a plurality of trellis encoders to perform trellis-encoding of a transport stream into which a supplementary reference signal (SRS) has been inserted at an insertion region, wherein memories included in the plurality of trellis encoders are reset before processing the transport stream at the insertion region into which the SRS has been inserted so as to remove a DC offset caused by the SRS.

24. The trellis encoding device of claim 23, further comprising a parity compensation unit including an RS re-encoder to generate parities corresponding to memory storage values output from the respective trellis encoders, an adder to add the parities generated by the RS re-encoder to an externally inputted packet and a MUX to store the added data.

25. The trellis encoding device of claim 24, further comprising a splitter to sequentially output the transport stream provided from the MUX to the trellis encoders.

26. The trellis encoding device of claim 25, further comprising an encoding output unit to sequentially detect the encoded values outputted from the respective trellis encoders, and to sequentially output the detected encoded values to a mapper.

* * * * *